United States Patent
Gunderson et al.

(10) Patent No.: US 8,281,190 B2
(45) Date of Patent: Oct. 2, 2012

(54) CIRCUITS AND METHODS FOR PROCESSING MEMORY REDUNDANCY DATA

(75) Inventors: Rosalee Gunderson, Fort Collins, CO (US); Dale Beucler, Fort Collins, CO (US); Louise A. Koss, Fort Collins, CO (US)

(73) Assignee: Avago Technologies Enterprise IP (Singapore) Pte. Ltd., Singapore (SG)

( * ) Notice: Subject to any disclaimer, the term of this patent is extended or adjusted under 35 U.S.C. 154(b) by 474 days.

(21) Appl. No.: 12/534,150

(22) Filed: Aug. 2, 2009

(65) Prior Publication Data

US 2011/0029813 A1   Feb. 3, 2011

(51) Int. Cl.
G11C 29/00 (2006.01)
G06F 11/00 (2006.01)
G01R 31/28 (2006.01)

(52) U.S. Cl. ............ 714/710; 714/30; 714/42; 714/718; 714/711; 714/726; 714/727; 714/729; 714/736; 714/742

(58) Field of Classification Search .................... 714/30, 714/42, 718, 710, 711, 726, 727, 729, 736, 714/742
See application file for complete search history.

(56) References Cited

U.S. PATENT DOCUMENTS

| | | | |
|---|---|---|---|
| 6,408,401 B1 | 6/2002 | Bhavsar et al. | |
| 6,445,627 B1 * | 9/2002 | Nakahara et al. | 365/200 |
| 6,496,431 B1 * | 12/2002 | Nakahara et al. | 365/200 |
| 6,697,290 B2 | 2/2004 | Koss et al. | |
| 6,768,694 B2 * | 7/2004 | Anand et al. | 365/225.7 |
| 6,856,569 B2 * | 2/2005 | Nelson et al. | 365/225.7 |
| 6,871,297 B2 * | 3/2005 | Puri et al. | 714/30 |
| 6,914,833 B2 | 7/2005 | Koss et al. | |
| 6,928,377 B2 | 8/2005 | Eustis et al. | |
| 7,055,075 B2 | 5/2006 | Koss et al. | |
| 7,152,187 B2 | 12/2006 | Tran et al. | |
| 7,386,771 B2 | 6/2008 | Shuma | |
| 7,415,640 B1 * | 8/2008 | Zorian et al. | 714/711 |
| 7,707,466 B2 * | 4/2010 | Gupta et al. | 714/718 |
| 7,757,135 B2 * | 7/2010 | Nadeau-Dostie et al. | 714/723 |
| 7,895,028 B2 * | 2/2011 | Anand et al. | 703/15 |
| 7,898,882 B2 * | 3/2011 | Darbinyan et al. | 365/200 |
| 8,055,956 B2 * | 11/2011 | Dubey et al. | 714/710 |
| 2008/0175079 A1 | 7/2008 | Jeon et al. | |
| 2011/0119531 A1 * | 5/2011 | Darbinyan et al. | 714/42 |

OTHER PUBLICATIONS

"65 Nanometer SoC Process Technology," 65 Nanometer—SoC Foundry Solution, published by UMC and available at www.umc.com.

* cited by examiner

Primary Examiner — John J Tabone, Jr.

(57) ABSTRACT

An interface processes memory redundancy data on an application specific integrated circuit (ASIC) with self-repairing random access memory (RAM) devices. The interface includes a state machine, a counter, and an array of registers. The state machine is coupled to a redundancy chain. The redundancy chain includes coupled redundant elements of respective memory elements on the ASIC. In a shift-in mode, the interface shifts data from each of the elements in the redundancy chain and compresses the data in the array of registers. The interface communicates with a test access port coupled to one or more eFuse devices to store and retrieve the compressed data. In a shift-out mode, the interface decompresses the data stored in the array of registers and shifts the decompressed data to each unit in the redundancy chain. The interface functions absent knowledge of the number, bit size and type of self-repairing RAM devices in the redundancy chain.

20 Claims, 10 Drawing Sheets

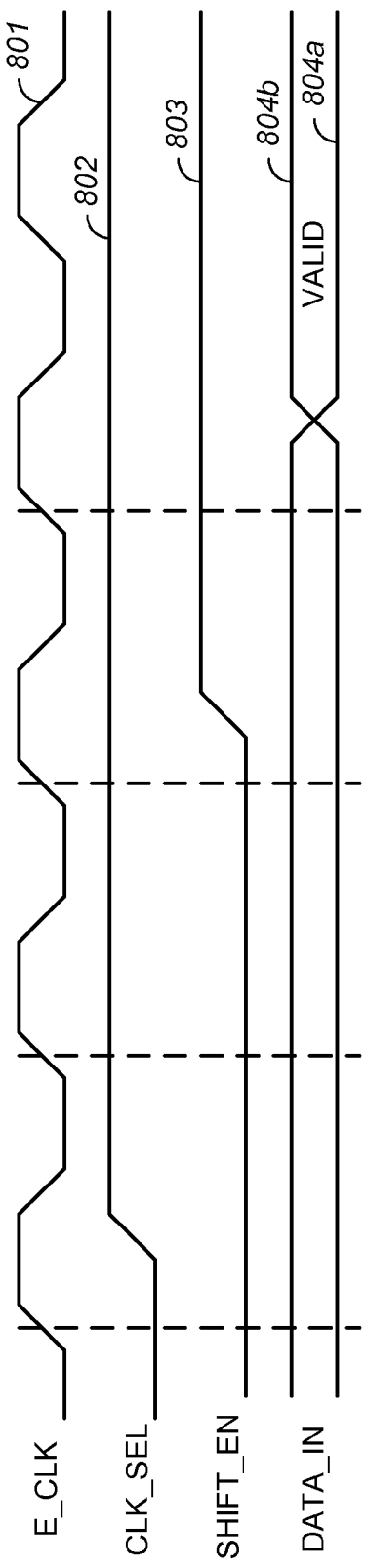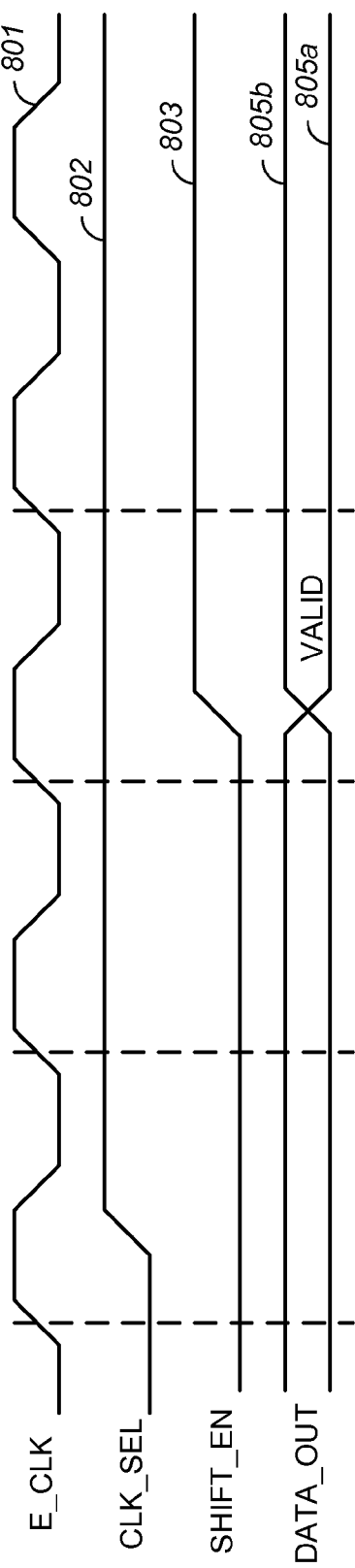

CIRCUITS AND METHODS FOR PROCESSING MEMORY REDUNDANCY DATA

BACKGROUND

Modern microprocessors employ large on-chip random access memories (RAMs) in a variety of ways to enhance performance. These RAMs are typically static (SRAMs) due to associated speed advantages. The most common usage is in the form of on-chip caches. In many instances, such RAMs constitute the majority of transistors consumed on chip and are the largest occupants of chip area.

Embedded RAMs give rise to two particular problems during chip manufacturing. Because an embedded RAM occupies a significant portion of a chip's area, the probability that a defect lies within the RAM is relatively high. The RAM thus becomes a controlling factor in chip yield. Second, the embedding of RAM not only makes its own testing difficult, but also impairs testability of all other functions on chip, such as the core logic. For example, much of the testing of other functions requires the use of the embedded RAM, which must function properly.

Traditionally, semiconductor manufacturers have tackled RAM yield problems by incorporating a repair scheme with redundant rows and/or columns. For embedded RAM, however, this compounds the testing problems because a diagnosis to identify defects and the repair of those defects are required before the testing of core logic, for example, can begin.

Built-in Self-Test (BiST or BIST) and Built-in Self-Repair (BiSR or BISR) have been implemented as a solution to both of the above problems. Conventional solutions include both "soft" and "hard" repair solutions. A "soft" repair solution is based in software and must be performed each time the integrated circuit is powered-up. A "hard" repair solution is performed once and is available upon applying power to the integrated circuit.

Self-repairing memory elements are described in U.S. Pat. No. 6,697,290 and U.S. Pat. No. 6,914,833. Embedded circuitry is used to test the memory element. Each self-repairing memory element includes a number of bits represented by circuit elements referred to as a bit slice as well as a redundant bit slice. A bit slice includes an array, a sense amplifier and an input/output (I/O) block. When the array of bit slices forming a memory element does not include a defect, as indicated by a pass condition, the redundant bit slice is not used. When a defect is encountered, data flow is routed around the bit slice containing the defect and the redundant bit slice is used in its place. Any and all defects occurring in the same bit slice can be repaired as a repair occurs as the result of a rerouting or remapping of bit slices such that the defect or defects are bypassed.

Integrated circuits with embedded memory elements with "hard" repair capability may use an eFuse module electrically coupled to the memory elements. The eFuse module contains one-time programmable fuse-like elements that can be used to store information. One application of this technology is to provide circuit performance tuning. If certain sub-systems fail, are taking too long to respond, or are consuming too much power, the integrated circuit can change configuration behavior by "blowing," that is, opening a fuse within a programmable eFuse circuit. When an eFuse module is used to store repair information, some embodiments include additional control logic for programming and loading the repair information into the memory elements. The repair information is loaded into the memory elements from the eFuse module shortly after integrated circuit power up.

These conventional solutions use top-level routing resources to integrate multiple circuits for communicating with test and embedded memory interfaces. These conventional solutions often restrict the placement and grouping of embedded memory circuits based on memory size, performance and type. In addition to the above restrictions, the conventional solutions require significant modification to the embedded memory circuits and significant processing time as each individual memory group is issued a request from the test interface before information is communicated from a particular embedded memory to the test interface.

SUMMARY

An embodiment of an interface for processing memory redundancy data on an application specific integrated circuit (ASIC) with self-repairing random access memory (RAM) elements comprises a state machine, a counter and an array of registers. The state machine is arranged with a data input and a data output coupled to a redundancy chain. The state machine generates first, second and third control signals, among other control signals. The counter receives the first control signal and generates a present count. The array of registers receives the second and third control signals from the state machine. The interface processes redundancy data received from the redundancy chain. The redundancy chain includes coupled serial-shift registers of redundant elements of respective self-repairing RAM devices on the ASIC.

In a first mode of operation, performed after a built-in self test of the ASIC, the interface shifts-in, compresses and stores a compressed representation of the information from the redundancy chain. In a second mode of operation, the interface operates in conjunction with a test access port (TAP) to communicate and store the compressed representation of the information in the redundancy chain by programming one or more eFuse device(s) coupled to the interface via the TAP. The information stored in the one or more eFuse device(s) is confirmed by removing and reapplying power to the ASIC, downloading the information stored in the one or more eFuse device(s) to the interface, decompressing and shifting the information to the serial-shift registers of the redundant memory elements of the respective self-repairing RAM elements in the redundancy chain.

An embodiment of a method for processing memory redundancy data includes the steps of coupling serial-shift registers associated with respective redundant elements included in RAM elements on an ASIC to form a redundancy chain, reading memory redundancy data from the serial-shift registers of the redundancy chain, compressing the memory redundancy data in an interface coupled to both the core logic and a test access port (TAP) on the ASIC, wherein compressing comprises the step-wise comparison of information in the memory redundancy data, the step-wise comparison responsive to an indication that a bit slice in a particular location in the redundancy chain has been replaced by a redundant memory element, storing the compressed memory redundancy data in the interface, coupling an eFuse device to the TAP, communicating the compressed memory redundancy data from the interface to the eFuse device via the TAP for storage in the eFuse device, and confirming the compressed memory redundancy data stored in the eFuse device by downloading the same to the interface via the TAP, storing the compressed memory redundancy data in the interface, using the interface to decompress and shift the compressed memory redundancy data through the serial-shift registers of the redundancy chain.

The figures and detailed description that follow are not exhaustive. The disclosed embodiments are illustrated and described to enable one of ordinary skill to make and use the circuits and methods for processing memory redundancy data. Other embodiments, features and advantages of the circuits and methods will be or will become apparent to those skilled in the art upon examination of the following figures and detailed description. All such additional embodiments, features and advantages are within the scope of the circuits and methods as defined in the accompanying claims.

BRIEF DESCRIPTION OF THE FIGURES

The circuits and methods for processing memory redundancy data can be better understood with reference to the following figures. The components within the figures are not necessarily to scale, emphasis instead being placed upon clearly illustrating the principles of capturing, loading, compressing, storing, decompressing and unloading the memory redundancy data to repair embedded memory in an application specific integrated circuit. Moreover, in the figures, like reference numerals designate corresponding parts throughout the different views.

FIG. 8A is a waveform diagram of an embodiment of the relative signal timing of a shift-in operation directed by the RAM eFuse interface of FIG. 1.

FIG. 8B is a waveform diagram of an embodiment of the relative signal timing of a shift-out operation directed by the RAM eFuse interface of FIG. 1.

DETAILED DESCRIPTION

Figure 1:
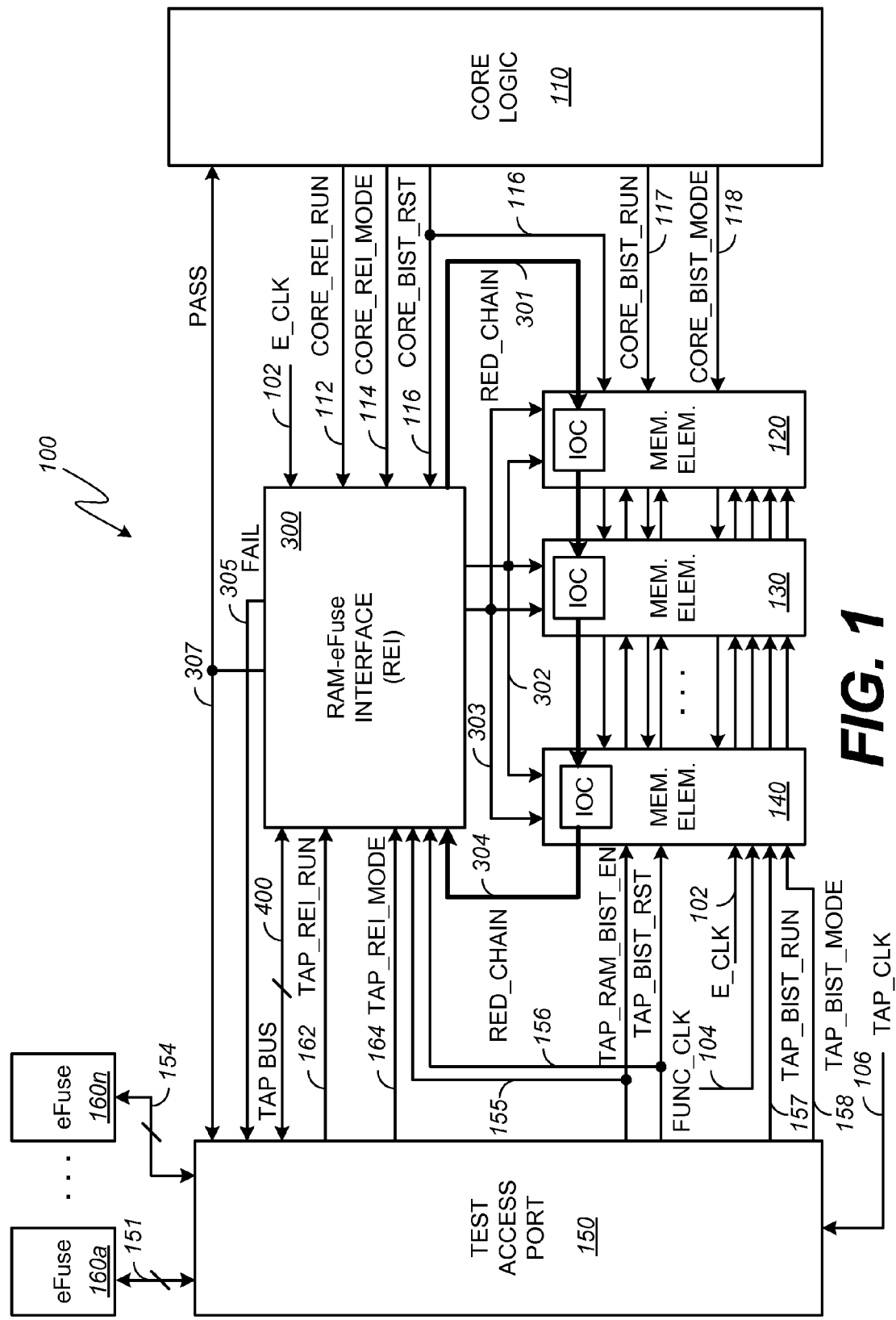
FIG. 1 is a functional block diagram of an example embodiment of an application specific integrated circuit.

An interface processes memory redundancy data on an application specific integrated circuit (ASIC) with self-repairing random access memory (RAM) elements. The interface includes a state machine, a counter, and an array of registers, among other elements. The state machine is coupled to a redundancy chain. The redundancy chain includes coupled serial-shift registers of redundant memory elements of respective self-repairing memory devices on the ASIC. In a shift-in mode, the interface shifts data from each of the serial-shift registers in the redundancy chain and compresses the data in the array of registers. In a shift-out mode, the interface decompresses the data stored in the array of registers and shifts the decompressed data to each self-repairing memory device in the redundancy chain. The interface functions absent knowledge of the number and type of self-repairing RAM elements in the redundancy chain.

Self-repairing RAM elements are connected to one another and to the interface to complete the redundancy chain. Psuedo Dual-Port RAM (PDP SRAM), one port SRAM, ternary content addressable memory (TCAM) or any type of redundant memory, having any number of bits, can be connected in the redundancy chain. The sequence of individual memory elements forming the redundancy chain can be in any order. Each individual memory element in the redundancy chain is connected with the data-out port coupled to the next memory element's data-in port. The individual bits identifying the configuration of each self-repairing RAM element are generated by a respective bit I/O unit associated with each bit in the memory element. The redundancy chain begins and ends at the interface.

When a defect is identified in a particular memory element, a configuration register in the input/output section of the memory element records the location of the defect by storing a logical "one" value. Redundancy information includes the chain of data bits from the corresponding configuration registers of each bit slice from the first bit slice of the first memory element in the redundancy chain through to the last bit slice from the last memory element in the redundancy chain.

As will be described in greater detail in association with the circuits and timing diagrams of FIGS. 1 and 3-7, the REI works together with the TAP to write or burn the redundancy data into one or more eFuse devices. Once the redundancy data has been recorded to the eFuse device(s), the REI can be configured via the TAP or the core logic to read the redundancy data from the eFuse device(s) and shift the redundancy data into the memory elements coupled in the redundancy chain.

The RAM-eFuse interface (REI) reads in all redundancy information from the memory elements connected in the redundancy chain. The redundancy information is configured during a BIST performed in the manufacturing of the ASIC. Upon completion of the BIST, the redundancy chain contains the mapping information that identifies the individual bit slices that are repaired. The REI shifts or scans in the redundancy data from each of the daisy-chained configuration registers (i.e., the serial-shift registers associated with each self-repairable memory device in the redundancy chain).

The REI functions in accordance with a clock that can be independent of the functional memory clock. A high percentage of the bits stored in the configuration registers of each memory element will indicate a functioning bit slice. Consequently, the REI detects and records the position in the redundancy chain associated with a defective bit slice. Only information associated with defective bit slices from the redundancy chain is recorded in the REI. The REI can be configured to identify any desired number of defective bit slices in the self-repairing RAM elements on an ASIC. That is, the storage capacity of the REI can be adjusted by adding or subtracting registers from the storage array associated with the REI to support any number of data bits in a redundancy chain and any number of repaired memory elements. In a preferred embodiment, an ASIC includes a single REI and a single redundancy chain that supports each self-repairing memory device on the ASIC. However, an ASIC can be arranged with any number of REIs and any number of redundancy chains. When the number of REIs on the ASIC is less than the number of redundancy chains, the ASIC will require additional control logic to couple and decouple the redundancy chains from one or more REIs.

Once the REI has compressed and stored the mapping information, the TAP reads the compressed version of the redundancy mapping information and stores the information in an eFuse block by programming (i.e., opening a circuit) eFuse elements in the eFuse block. Once programmed, the eFuse block contains a non-volatile record of the redundancy mapping information that is maintained even when the ASIC is powered off.

Thereafter, the repair process is confirmed by applying power to the ASIC and downloading the stored redundancy mapping information from the eFuse block to the storage array within the REI. The REI is then used to decompress and shift the redundancy mapping information through the redundancy chain. Once the decompression and shifting process has completed, a BIST is performed in the non-repair mode to confirm that each self-repairing memory device in the redundancy chain functions nominally (i.e., each memory device passes the BIST). Each time the ASIC is powered up, an initialization procedure downloads the compressed redundancy mapping information from the eFuse block to the REI. In turn, the REI decompresses and shifts the decompressed redundancy mapping information through the serial-shift registers of the self-repairing memory devices in the redundancy chain.

Turning now to the drawings, wherein like reference numerals designate corresponding parts throughout the drawings, reference is made to FIG. 1 which illustrates an embodiment of an ASIC 100. The ASIC 100 includes a RAM-eFuse interface (REI) 300 controlled by either the core logic 110 or a test access port (TAP) 150. The core logic 110 includes circuits for handling memory functions, one or more non-redundant memories for storing and/or queuing instructions, logic for bus interfaces and logic for enabling application specific functions on the ASIC 100. The TAP 150 includes circuits for exposing the core logic 110 to one or more external devices configured to test the ASIC 100. The ASIC 100 further includes a self-repairing memory element 120, a self-repairing memory element 130 and a self-repairing memory element 140. Although three self-repairing memory elements are shown in the example embodiment, it should be understood that the number of self-repairing memory elements is limited only by the semiconductor device technology and the physical size of the die.

The TAP 150 is connected to a desired number of eFuse devices 160a-160n for storing the redundancy data. For example, TAP 150 is coupled to eFuse 160a on connection 151 and eFuse 160n on connection 154. In an example embodiment, the TAP 150 is coupled to four eFuse devices 160a-160n having a storage capability of 128×1 bits each. Alternative configurations including a different number of eFuse devices and or an alternative storage size within each eFuse device can be arranged as desired. As will be explained in greater detail in association with FIG. 4 and the relative timing diagrams of FIGS. 5, 6 and 7, the REI 300 directs the TAP 150 via the TAP bus 400 to write (or burn) redundancy information to the eFuse devices 160a-160n and read redundancy information from the eFuse devices 160a-160n. The TAP bus 400 is asynchronous as the TAP 150 and the REI 300 operate in accordance with separate and distinct clock signals. The TAP 150 functions in accordance with a TAP_CLK signal received on connection 106, whereas the REI 300 functions in accordance with an E_CLK signal received on connection 102.

In addition to the signals that form the TAP bus 400, the TAP 150 provides a number of additional signals to the REI 300. A TAP_REI_RUN signal is provided to the REI 300 on connection 162. In addition, a TAP_REI_MODE signal is provided on connection 164.

The TAP 150 further provides signals to both the REI 300 and each of the memory elements in the redundancy chain (i.e., memory element 120, memory element 130 . . . memory element 140). The redundancy chain begins and ends with the REI 300 and includes a number of embedded self-repairing memory elements such as the memory element 120, the memory element 130 and the memory element 140. The redundancy chain is illustrated using a thicker line width than other connections to the REI 300. In the example embodiment, the redundancy chain progresses in a clockwise fashion exiting the REI 300 on connection 301 and proceeding in a daisy chain through an input/output controller (IOC) in the self-repairing memory elements. Details and operation of an example embodiment of an IOC will be presented in association with FIG. 2 and the related detailed description. The redundancy chain returns to the REI 300 via connection 304.

A TAP_RAM_BIST_EN signal is provided on connection 155 and a TAP_BIST_RST signal is provided on connection 156 to both the REI 300 and to each of the respective self-repairing memory elements in the redundancy chain. The TAP_RAM_BIST_EN signal on connection 155, when asserted, provides the TAP 150 exclusive control of the REI 300. The TAP_RAM_BIST_EN signal is asserted before TAP-controlled signals are sent and remains asserted throughout TAP-controlled operations. The TAP_BIST_RST signal on connection 156 resets selected logic in the REI 300 and the respective memory elements in the redundancy chain. The TAP_REI_RUN signal on connection 162 is enabled after the TAP_RAM_BIST_EN signal is asserted. The TAP_REI_RUN signal on connection 162 remains asserted until the REI indicates completion via the PASS output signal on connection 307 or the FAIL output signal on connection 305. When the TAP_REI_RUN signal is asserted, one of four operations identified by the TAP_REI_MODE signal on connection 164 will be executed by the REI 300. When the TAP_REI_MODE signal on connection 164 is "00," the REI 300 is instructed to read data from the eFuse devices 160a-160n and store the same in internal registers within the REI 300. When the TAP_REI_MODE signal on connection 164 is "01," the REI 300 is instructed to decompress the pattern stored in the internal registers and load the redundancy configuration into the respective memory elements within the redundancy chain. When the TAP_REI_MODE signal is "10," the REI 300 is directed to program the eFuse devices 160a-160n with a compressed pattern via the TAP 150. When the TAP_REI_MODE signal is "11," the REI 300 is instructed to read the redundancy configuration information from the respective memory elements of the redundancy chain and compress the pattern in its internal registers.

Furthermore, the TAP 150 provides signals to the respective self-repairing memory elements of the redundancy chain. For example, the TAP 150 provides a TAP_BIST_RUN signal on connection 157 and a TAP_BIST_MODE signal on connection 158 to each of the respective memory elements in the redundancy chain. When the TAP_BIST_RUN signal is asserted, the TAP 150 is not accessing the REI 300 and BIST is performed on the respective self-repairing memory elements (e.g., memory element 120, memory element 130 and memory element 140).

The TAP_RAM_BIST_EN signal on connection 155, when deasserted, provides exclusive control of the REI 300 to the core logic 110. The TAP_RAM_BIST_EN signal on connection 155 is deasserted before core-logic controlled signals are sent and remains deasserted throughout core-logic controlled operations.

The core logic 110 provides a number of signals to the REI 300. The CORE_BIST_RST signal on connection 116 resets select logic in the REI 300 and the respective memory elements in the redundancy chain. The CORE_REI_RUN signal on connection 112 is enabled after the TAP_RAM_BIST_EN signal on connection 155 is deasserted. The CORE_REI_RUN signal on connection 112 remains asserted until the REI 300 indicates completion via the PASS output signal on connection 307. When the CORE_REI_RUN signal on connection 112 is asserted, one of two operations identified by the CORE_REI_MODE signal on connection 114 will be executed by the REI 300. When the CORE_REI_MODE signal on connection 114 is "0," the REI 300 is instructed to read data from the eFuse devices 160a-160n and stores the same in internal registers within the REI 300. When the CORE_REI_MODE signal on connection 114 is "1," the REI 300 is instructed to decompress the pattern stored in the internal registers and load the redundancy configuration into the respective memory elements within the redundancy chain.

Furthermore, the core logic 110 provides signals to the respective self-repairing memory elements of the redundancy chain. For example, the core logic 110 provides a CORE_BIST_RUN signal on connection 117 and a CORE_BIST_MODE signal on connection 118 to each of the respective memory elements in the redundancy chain. When the CORE_BIST_RUN signal is asserted, the core logic 110 is not accessing the REI 300. When the CORE_BIST_RUN signal is asserted, BIST is performed on the respective self-repairing memory elements.

The ASIC 100 operates in accordance with multiple clock signals. An E_CLK is supplied to the REI 300 and to each of the respective self-repairing memory elements in the redundancy chain on connection 102. A functional or nominal clock signal (i.e., FUNC_CLK) is provided to each of the respective self-repairing memory elements of the redundancy chain. The FUNC_CLK signal provided on connection 104 is significantly faster than the E_CLK signal on connection 102. The E_CLK signal, which in one example embodiment has a frequency of less than 50 MHz, is used exclusively by the REI 300. The FUNC_CLK signal, which may be more than an order of magnitude faster than the E_CLK signal, is used by the self-repairing memory elements (e.g., memory element 120, memory element 130 and memory element 140) when the ASIC 100 is performing a TAP or core-logic controlled test or when the ASIC 100 is operating functionally.

In addition to connection 301, which couples the REI 300 to the memory element 120, the REI 300 provides four other output signals. A CLK_SEL signal is provided on connection to 302 to each respective self-repairing memory element in the redundancy chain. A SHIFT_EN signal is also provided on connection 303 to each respective self-repairing memory element in the redundancy chain. A FAIL signal is provided on connection 305 to the TAP 150. A PASS signal is provided on connection 307 to both the core logic 110 and the TAP 150. The CLK_SEL signal on connection 302 directs each of the self-repairing memory elements to operate in accordance with one of the E_CLK signal on connection 102 or the FUNC_CLK signal on connection 104. The SHIFT_EN signal on connection 303 enables a shifting operation that shifts the respective configuration bits from each slice of the self-repairing memory elements in the redundancy chain in a serial manner along the chain. Only one of the PASS signal or the FAIL signal will be asserted upon completion of the corresponding mode of operation. The REI 300 will assert the FAIL signal when the REI 300 stored data indicates that the number of repairs required in the redundancy chain exceeds the capacity of the eFuse devices 160a-160n.

Figure 2:
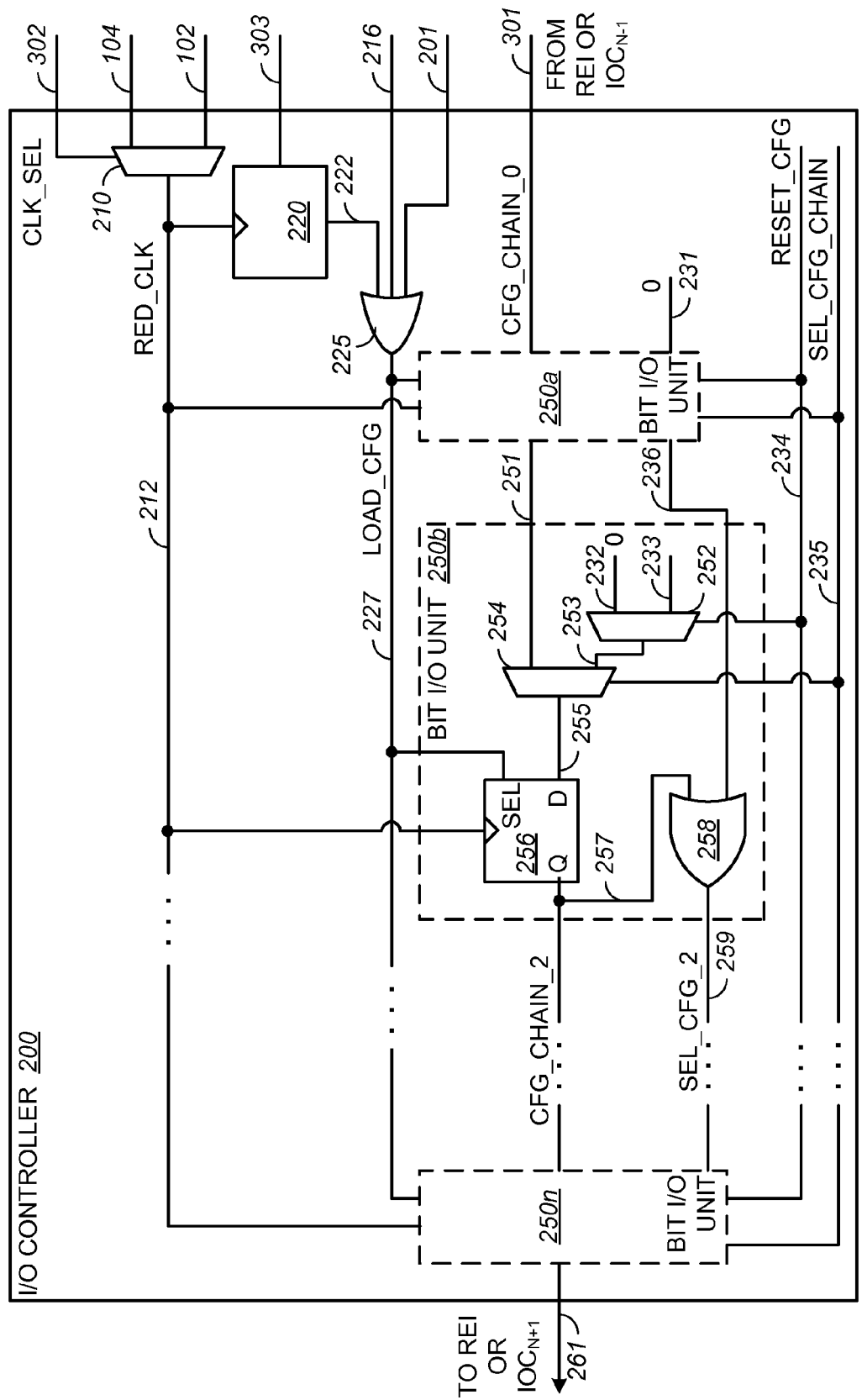
FIG. 2 is a schematic diagram illustrating an embodiment of an input/output section of a self-repairable memory element of FIG. 1.

FIG. 2 is a schematic diagram illustrating an example embodiment of an input/output (I/O) controller 200 of a self-repairing memory element of FIG. 1. The I/O controller 200 is a device for receiving, buffering, and forwarding configuration bits from bit I/O units 250a-250n. As indicated in FIG. 2, the I/O controller 200 is arranged to receive the E_CLK signal on connection 102 and the FUNC_CLK signal on connection 104. Multiplexer 210, as directed by the CLK_SEL signal on connection 302, forwards one of the E_CLK signal or the FUNC_CLK signal on connection 212 to the bit I/O units 250a-250n. The multiplexer 210 enables the REI 300 to control which clock is selected in the I/O controller 200.

The I/O controller 200 receives redundancy data on connection 301 from either the REI 300 or a previous SRAM in the redundancy chain. The received redundancy data signal on connection 301 is forwarded to bit I/O unit 250a. The bit I/O unit 250a also receives a logic "0" on connection 231. As will be explained in greater detail in association with bit I/O unit 250b, bit I/O unit 250a forwards the content of an internal data register under the direction of the RESET_CFG signal on connection 234 and the SEL_CFG_CHAIN signal on connection 235.

In addition, the I/O controller 200 receives the SHIFT_EN signal on connection 303, which is coupled to the data input of the register 220, and further receives one of the CORE_BIST_RST signal or the TAP_BIST_RST signal on connection 216 and a BIST_LOAD_CFG signal on connection 201. The signal on connection 216 is dependent on the condition of the TAP_RAM_BIST_EN signal on connection 155 (FIG. 1). When the TAP_RAM_BIST_EN signal is at a voltage associated as a logic "1" value, the TAP_BIST_RST signal is provided. Otherwise, when the TAP_RAM_BIST_EN signal is at a voltage associated with a logic "0" value, the CORE_BIST_RST signal is provided. The selected clock signal is coupled to the clock input of the register 220 on connection 212. In turn, the register 220 forwards a SHIFT_EN signal on connection 222 to an input of the OR gate 225. In addition to the SHIFT_EN signal, the OR gate 225 also receives one of the CORE_BIST_RST signal or the TEST_BIST_RST signal on connection 216 and the BIST_LOAD_CFG signal on connection 201. The ASIC 100 is arranged such that the BIST reset signals on connection 216 and the BIST_LOAD_CFG signal connection 201, will not be asserted during operation of the REI 300. In accordance with OR logic, the OR gate 225 generates an output signal labeled LOAD_CFG that is forwarded to the bit I/O units 250a-250n on connection 227. The LOAD_CFG signal enables the loading of the configuration register 256 inside of each I/O unit 250a-250n. For simplicity of illustration and description circuit elements and interconnections within the bit I/O unit 250a and bit I/O unit 250n are omitted. Note that the I/O controller 200 will include one bit I/O unit 250a and one configuration register 256 (i.e., a serial-shift register) for each data bit in the corresponding self-repairing memory unit.

The bit I/O unit 250b contains a first signal on connection 232, which is permanently coupled to a voltage associated with a logic value of "0" and a second signal on connection 233. The signals on connection 232 and connection 233 are generated within the bit I/O unit and are coupled to the data inputs of the multiplexer 252 in the bit I/O unit 250b. The RESET_CFG signal on connection 234 is coupled to the control input of the multiplexer 252. One of the logic value of "0" or the second signal received on connection 233 is selectively forwarded in accordance with the RESET_CFG signal on connection 234 to connection 253 to a data input of the multiplexer 254. The multiplexer 254 receives the redundancy data signal or the CFG_CHAIN_1 signal on connection 251 at a first data input and the output of the multiplexer 252 on connection 253 at a second data input. The multiplexer 254, in accordance with a SEL_CFG_CHAIN input signal on connection 235, forwards one of the output of the multiplexer 252 or the CFG_CHAIN_1 signal on connection 251 to connection 255 to the data input of the register 256. In turn, the register 256 under the direction of a LOAD_CFG signal on connection 227, forwards the signal received on connection 255 to an input of the OR gate 258 and to the input of the next bit I/O unit 250$n$ (i.e., a CFG_CHAIN_2 signal) on connection 257. The OR gate 258 receives a SEL_CFG_1 signal on connection 236 and generates an output signal (i.e., the SEL_CFG_2 signal) in accordance with OR logic that is applied via connection 259 to the input of the next bit I/O unit 250$n$. The bit I/O units 250$a$-250$n$ store a logic "1" value in the register 256 when a self test failure has resulted in the corresponding bit location being replaced by the redundant bit slice of the self-repairing memory element. Otherwise, the bit I/O units 250$a$-250$n$ store a logic "0" value in the register 256. Similar processing is performed in each of the N bits of the corresponding self-repairing memory unit until the redundancy data has reached an output of the bit I/O unit 250$n$. The redundancy data is coupled via connection 261 to the REI 300 or to the I/O controller in the next adjacent self-repairing memory element in the redundancy chain.

Figure 3:
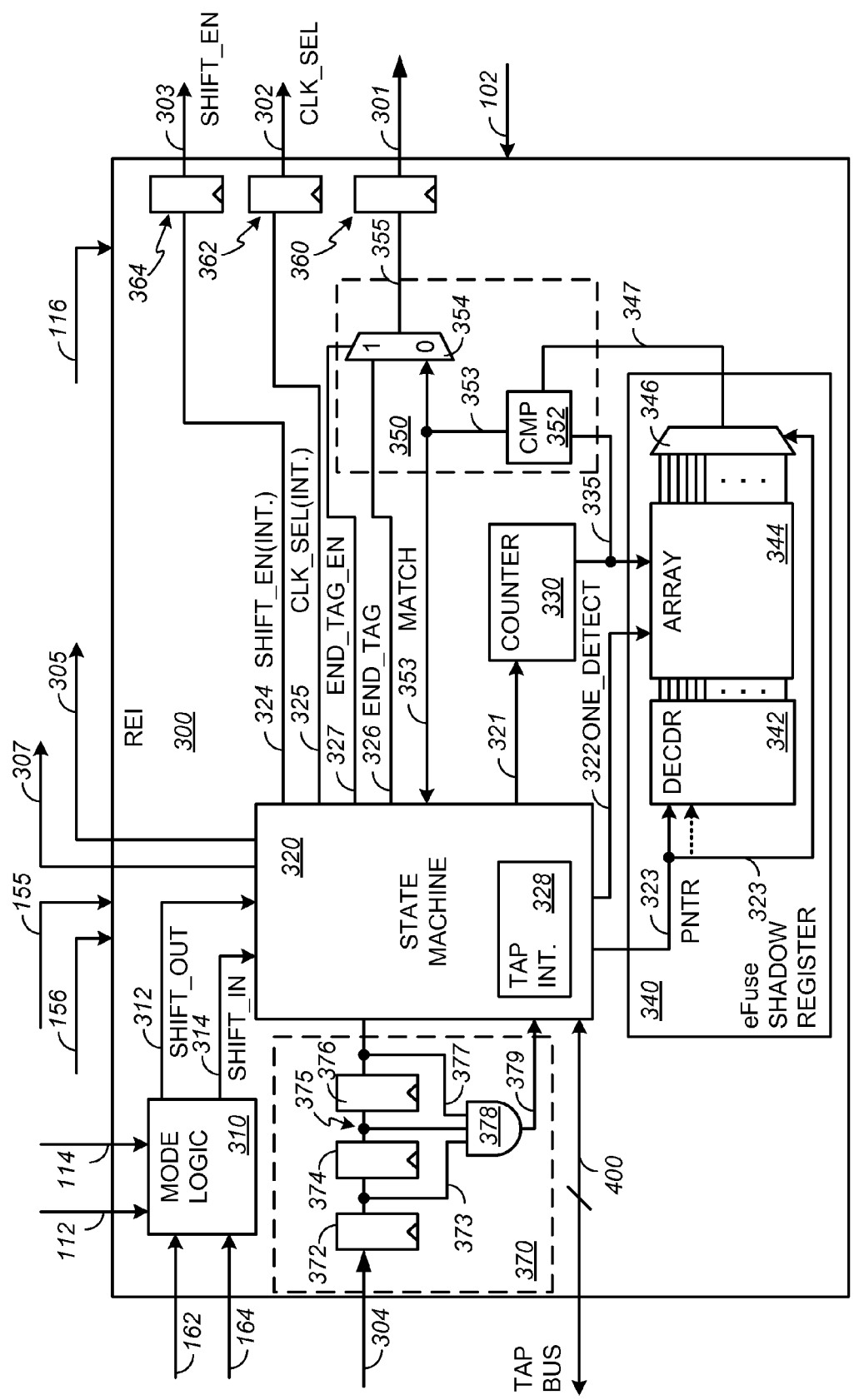
FIG. 3 is a functional block diagram of an embodiment of the RAM eFuse interface of FIG. 1.

FIG. 3 is a functional block diagram of an example embodiment of the REI 300 of FIG. 1. The REI 300 includes a mode logic element 310, a state machine 320, a counter 330, an eFuse shadow register 340, a redundancy data controller 350, a first shift register 360, a second shift register 362, a third shift register 364 and a detector 370. The REI 300 operates in accordance with the E_CLK signal received on connection 102. The REI 300 functions as directed by the TAP 150 or the core logic 110 in accordance with a TAP_RAM_BIST_EN signal and additional mode control signals from the TAP 150 or the core logic 110. The REI 300 receives the TAP_RAM_BIST_EN signal on connection 155, the TAP_BIST_RST signal on connection 156 and the CORE_BIST_RST signal on connection 116. As described above, the TAP_RAM_BIST_EN signal determines which of the TAP 150 or the core logic 110 will direct operation of the REI 300. As also described above, each of the TAP_BIST_RST signal and the CORE_BIST_RST signal reset selected logic in the REI 300 and the respective memory elements in the redundancy chain.

The mode logic 310 receives the CORE_REI_RUN signal on connection 112 and the CORE_REI_MODE signal on connection 114. The CORE_REI_RUN and the CORE_REI_MODE signals are generated by the core logic 110. The CORE_REI_RUN signal on connection 112 is enabled when the TAP_RAM_BIST_EN signal is deasserted. When the CORE_REI_RUN signal is asserted, one of two operations identified by the CORE_REI_MODE signal on connection 114 is indicated. The CORE_REI_RUN signal on connection 112 will remain asserted until the REI 300 indicates completion.

The mode logic 310 receives the TAP_REI_RUN signal on connection 162 and the TAP_REI_MODE signal on connection 164. The TAP_REI_RUN and TAP_REI_MODE signals are generated by the TAP 150. The TAP_REI_RUN signal on connection 162 is enabled when the TAP_RAM_BIST_EN signal is asserted. When the TAP_REI_RUN signal is asserted, one of four operations identified by the TAP_REI_MODE signal on connection 164 is indicated. The TAP_REI_RUN signal on connection 162 remains asserted until the REI 300 indicates completion. The mode logic 310 processes the multiple mode input signals and asserts one of a SHIFT_IN signal on connection 314 or a SHIFT_OUT signal on connection 312. In addition to these signals, the mode logic 310 further forwards an indication to the state machine 320 whether a "write" mode or a "read" mode of operation is desired when communicating with the TAP 150. This can be accomplished by dedicated connections for each of the write and read commands (not shown). Alternatively, the mode logic 310 may be coupled to the state machine 320 via a multiple bit signal that identifies a desired REI operation.

The state machine 320 communicates with the eFuse devices 160$a$-160$n$ via the TAP interface 328 and the TAP bus 400. More specifically, the various signals on the TAP bus 400 generated in the TAP 150 are received in the TAP bus interface 328. TAP bus signals from the REI 300 are generated in the TAP bus interface 328. The various signals of the TAP bus 400 will be described in greater detail in association with the diagram illustrated in FIG. 4 and the related detailed description.

As introduced above, the REI 300 generates a CLK_SEL signal on connection 302 and a SHIFT_EN signal on connection 303. The CLK_SEL signal directs each of the self-repairing memory elements (FIG. 1) to operate in accordance with one of the E_CLK signal on connection 102 or the FUNC_CLK signal on connection 104 (FIG. 1). The SHIFT_EN signal on connection 303 enables a shifting operation that shifts the respective configuration bits from each bit slice of the self-repairing memory elements in the redundancy chain in a serial manner along the redundancy chain. The redundancy chain starts at connection 301 exiting the REI 300 and is returned to the REI 300 along connection 304.

The state machine 320, the counter 330 and the eFuse shadow register 340 operate together to shift-in and compress redundancy data from the self-repairing memory elements of the redundancy chain. In alternate modes of operation, the state machine 320, the counter 330 and the eFuse shadow register 340 operate together to decompress and forward previously compressed and stored redundancy information.

The eFuse shadow register 340 includes a decoder 342, an array of storage registers (i.e., array) 344 and a first multiplexer 346. The state machine 320 generates a first control signal, which is applied to the counter 330 on connection 321, a second control signal responsive to a first data value and labeled "ONE_DETECT" is applied to the array 344 on connection 322 and a third control signal labeled "PNTR", which is applied on connection 323 to the decoder 342 and the select input of the first multiplexer 346. The output of the counter 330, which generates a present count value, is coupled to a data input of the array 344 via connection 335. As data bits are clocked or shifted along the redundancy chain, the counter 330 keeps a running total (i.e., the present count) of the relative position of each bit in the redundancy chain. The state machine 320 asserts the second control signal on connection 322 when the state machine 320 receives a first data value in the redundancy data. In the preferred embodiment, the first data value is a logic "1" value. As indicated above, the presence of a logic "1" value in a particular position in the redundancy chain indicates that the redundant bit slice of the corresponding self-repairing memory element is being used. This remapping of the operation of the self-repairing memory element is recorded in the array 344 by storing the present count value in the first row of the array 344. Thereafter, the third control signal or PNTR signal on connection 323 directs the decoder 342 to select the second row of the array 344. Thus, when the state machine 320 detects the presence of the first data value in a subsequent bit position of the redundancy data, the second control signal on connection 322 is asserted and the array 344 stores the present count received on connection 335 from the counter 330 in the second row of the array 344. The shift-in operation continues until the state machine detects the end of the redundancy data information as indicated by a logic value "1" on connection 379 (i.e., assertion of the END_TAG_DETECT signal).

In an example embodiment, the counter 330 is an 18-bit counter and the array 344 includes 28 rows of 18 bits. A 28 row×18 bit array will identify 28 self-repaired memory devices in a redundancy chain of up to $2^{18}$ bits in length. In alternative embodiments, the counter 330 may be configured with less or more bits as desired and the array may be configured with less or more bits and less or more rows as desired. When the number of first data values detected in the redundancy data exceeds the number of rows in the array 344, state machine 320 asserts a FAIL signal on connection 305. Otherwise, the state machine 320 asserts a PASS signal on connection 307.

The state machine 320, the counter 330, the eFuse shadow register 340 and the redundancy data controller 350 operate together to communicate (write or read) the redundancy data via the TAP interface 328 and the TAP bus 400 to the eFuse devices 160a-160n. Alternatively, these units operate together to decompress and shift-out the previously stored and compressed redundancy data to the self-repairing memory elements of the redundancy chain. Before the shift-out operation commences, the state machine 320 and the counter 330 are reset by one of the CORE_REI_RUN signal or the TAP_REI_RUN signal being deasserted (depending on the TAP_RAM_BIST_EN signal).

In a shift-out mode of operation, the first multiplexer 346 is arranged to select a row in the array 344 in accordance with the third control signal or PNTR signal on connection 323. The redundancy data controller 350 receives the multiple bit word previously stored in the array 344. The redundancy data controller 350 includes a comparator 352 and a second multiplexer 354. The comparator 352 is arranged to receive the present count at a first input which is coupled to connection 335 and to receive a stored value at a second input from the first multiplexer 346 via connection 347. The comparator asserts a MATCH signal on connection 353, when the present count and the stored value match. The connection 353 is coupled to a first data input of the second multiplexer 354. The redundancy data controller 350 receives an END_TAG signal on connection 326, which is coupled to a second data input of the second multiplexer 354. The second multiplexer forwards one of the MATCH signal on connection 353 or the END_TAG signal on connection 326 in accordance with an END_TAG_EN signal communicated from the state machine 320 on connection 327. The output of the second multiplexer 354 is forwarded on connection 355 to the shift register 360, which registers the signal on connection 355. The output of the shift register 360 is coupled to connection 301 or the start of the redundancy chain.

To identify the end of the redundancy chain, the state machine 320 uses the END_TAG signal on connection 326 and the END_TAG_EN signal on connection 327 to direct the redundancy data controller 350 to forward three consecutive first logic values or logic "1" values along the redundancy chain. When each self-repairing memory element in the redundancy chain is configured with a single redundant bit slice, it is never the case that three consecutive bit slices will be replaced by redundant bit slices. Consequently, three consecutive first logic values in the redundancy chain data are sufficient to identify the start and or end of the chain. Thereafter, the state machine 320 deasserts the END_TAG_EN signal on connection 327 and the redundancy data controller 350 forwards a second logic value or a logic "0" value as long as the present value and the first stored error location do not match. When the present value and the stored value match, the comparator 352 generates a logic "1" on connection 353, which is communicated back to the state machine 320 and forwarded via connection 355 and shift register 360 to the redundancy chain. In turn, the state machine 320 adjusts the third control signal on connection 323 to direct the first multiplexer to select the information stored in the second row of the array 344. This operation repeats until the detector 370 indicates the presence of three consecutive first logic values in the redundancy data returned to the REI 300 on connection 304.

The detector 370 includes three serially arranged shift registers and a three-input AND gate. A shift register 372 is arranged to receive the redundancy data along connection 304 and forwards the same on connection 373 which is coupled to the data input of the shift register 374 and an input of the AND gate 378. The shift register 374 receives the redundancy data on connection 373 and forwards the same on connection 375, which is coupled to the data input of shift register 376 and a second input of the AND gate 378. The shift register 376 receives the redundancy data on connection 375 and forwards the same on connection 377, which is coupled to a data input of the state machine 320 and a third input of the AND gate 378. When three consecutive logic "1" values are present in the redundancy data, a detector signal (END_TAG_DETECT) is asserted at the output of the AND gate 378 and forwarded via connection 379 to the state machine 320. The assertion of the detector signal on connection 379 directs the state machine 320 to assert one of the PASS signal on connection 307 or the FAIL signal on connection 305. The REI 300 asserts the FAIL signal on connection 305 when the REI 300 stored data indicates that the number of repairs required in the redundancy chain exceeds the capacity of the eFuse devices 160a-160n and the number of rows in the array 344. Otherwise, the REI 300 asserts a PASS signal on connection 307.

The state machine 320 asserts additional control signals that direct the shifting of data in a controlled fashion through the self-repairing memory elements in the redundancy chain. A fourth control signal is generated and communicated on connection 325 to shift register 362, which registers the CLK_SEL signal before communicating the same to each of the I/O controllers in the corresponding self-repairing memory elements via connection 302. As indicated above, the CLK_SEL signal directs each memory device to operate in accordance with an E_CLK signal or a FUNC_CLK signal.

A fifth control signal is generated and communicated on connection 324 to shift register 364, which registers the SHIFT_EN signal before communicating the same on connection 303 to each of the I/O controllers in the self-repairing memory elements in the redundancy chain. The fifth control signal directs each self-repairing random access memory element in the redundancy chain to shift one bit.

Figure 4:
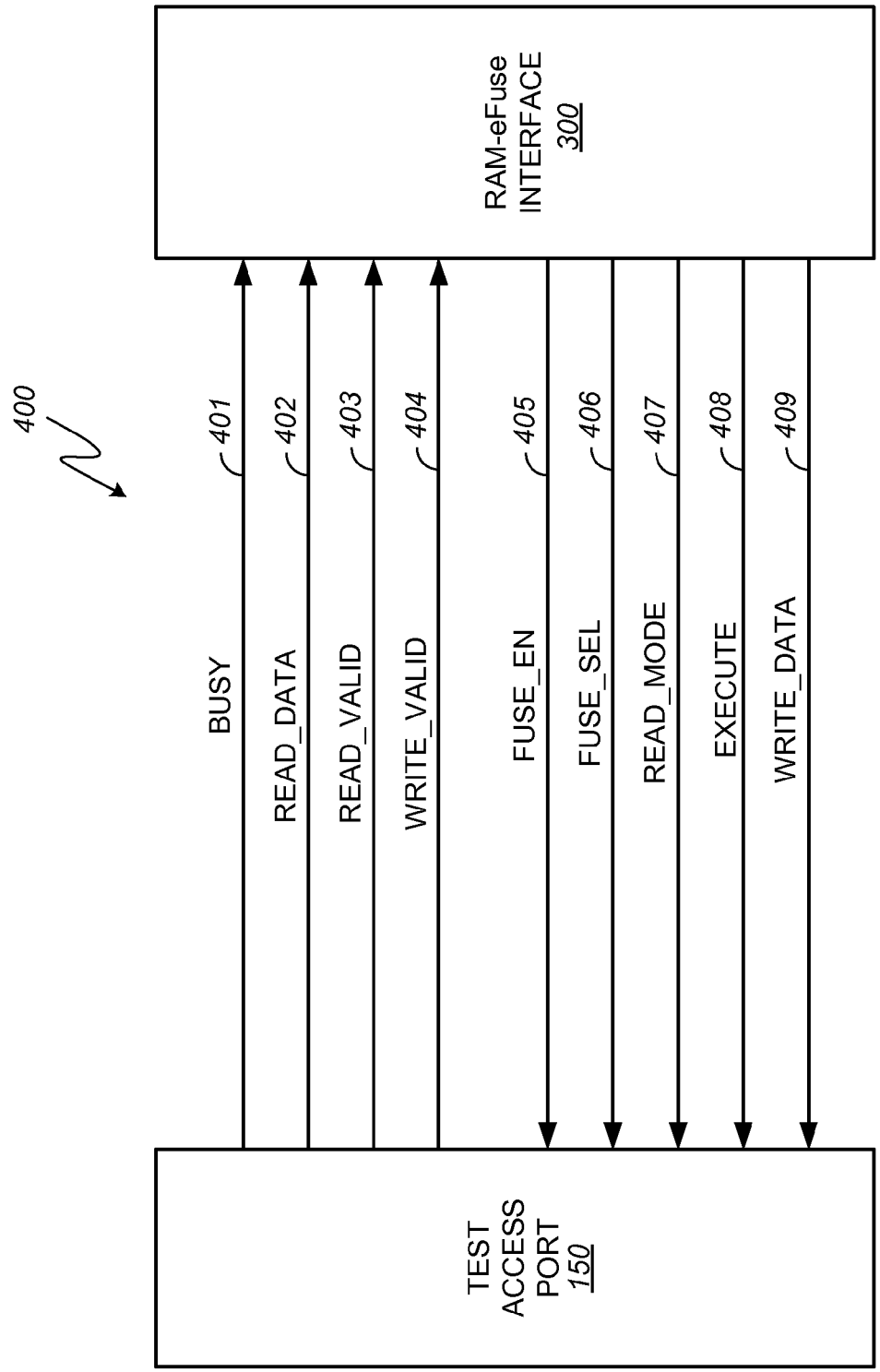
FIG. 4 is a functional block diagram of an embodiment of the test access port bus, "TAP_BUS", of FIG. 1.

FIG. 4 is a functional block diagram of an example embodiment of the TAP bus 400 of FIG. 1. The TAP bus 400 includes four signals that originate in the TAP 150 and terminate in the REI 300. A BUSY, READ_DATA, READ_VALID and WRITE_VALID signals originate in the TAP 150 and terminate in the REI 300. The TAP bus 400 further includes five signals that originate in the REI 300 and terminate in the TAP 150. A FUSE_EN, FUSE_SEL, READ_MODE, EXECUTE and WRITE_DATA signals originate in the REI 300 and terminate in the TAP 150.

The FUSE_EN signal is communicated on connection 405. The FUSE_EN signal is asserted by the REI 300. When asserted, the FUSE_EN signal enables the TAP-REI interface or TAP bus 400. A FUSE_SEL signal is communicated on connection 406. The FUSE_SEL signal is asserted by the REI 300. The FUSE_SEL signal identifies the address of a select eFuse coupled to the TAP 150. Although illustrated as a single conductor, it should be understood that connection 406 contains multiple conductors. The number of conductors decodes into the number of separate eFuse devices that can be addressed. A READ_MODE signal is communicated on connection 407. The REI 300 asserts the READ_MODE signal. When asserted, the READ_MODE signal indicates that data should be read from the addressed eFuse. When deasserted, the READ_MODE signal indicates that data should be stored or burned to the addressed eFuse. An EXECUTE signal is communicated on connection 408. The REI 300 asserts the EXECUTE signal. When asserted, the EXECUTE signal indicates that write data is valid or that the REI 300 is ready to receive eFuse data from the TAP 150. A WRITE_DATA signal is communicated on connection 409. The REI 300 asserts the WRITE_DATA signal. When asserted together with the EXECUTE signal, the WRITE_DATA signal indicates to the TAP 150 the data value 0 or 1 to be burned to the corresponding eFuse device bit.

A BUSY signal is communicated on connection 401. The TAP 150 asserts the BUSY signal. When asserted, the BUSY signal indicates that the TAP-eFuse interface is busy. When the BUSY signal is not asserted, the REI 300 receives an indication that the TAP-eFuse interface is idle and ready to burn information to or read information from a different eFuse. A READ_DATA signal is communicated on connection 402. The READ_DATA signal is asserted by the TAP 150. The READ_DATA signal indicates to the REI 300 the value read from the addressed eFuse through the TAP 150. A READ_VALID signal is communicated on connection 403. The READ_VALID signal is asserted by the TAP 150. The READ_VALID signal is asserted when the READ_DATA signal has been valid for at least one TAP_CLK clock cycle. The READ_VALID signal indicates to the REI 300 that READ_DATA signal should be read. A WRITE_VALID signal is communicated on connection 404. The WRITE_VALID signal is asserted by the TAP 150. The WRITE_VALID signal is asserted when the EXECUTE and READ_MODE signals from the REI 300 indicate a burn and the TAP 150 has captured the WRITE_DATA signal on connection 409.

Figure 5:
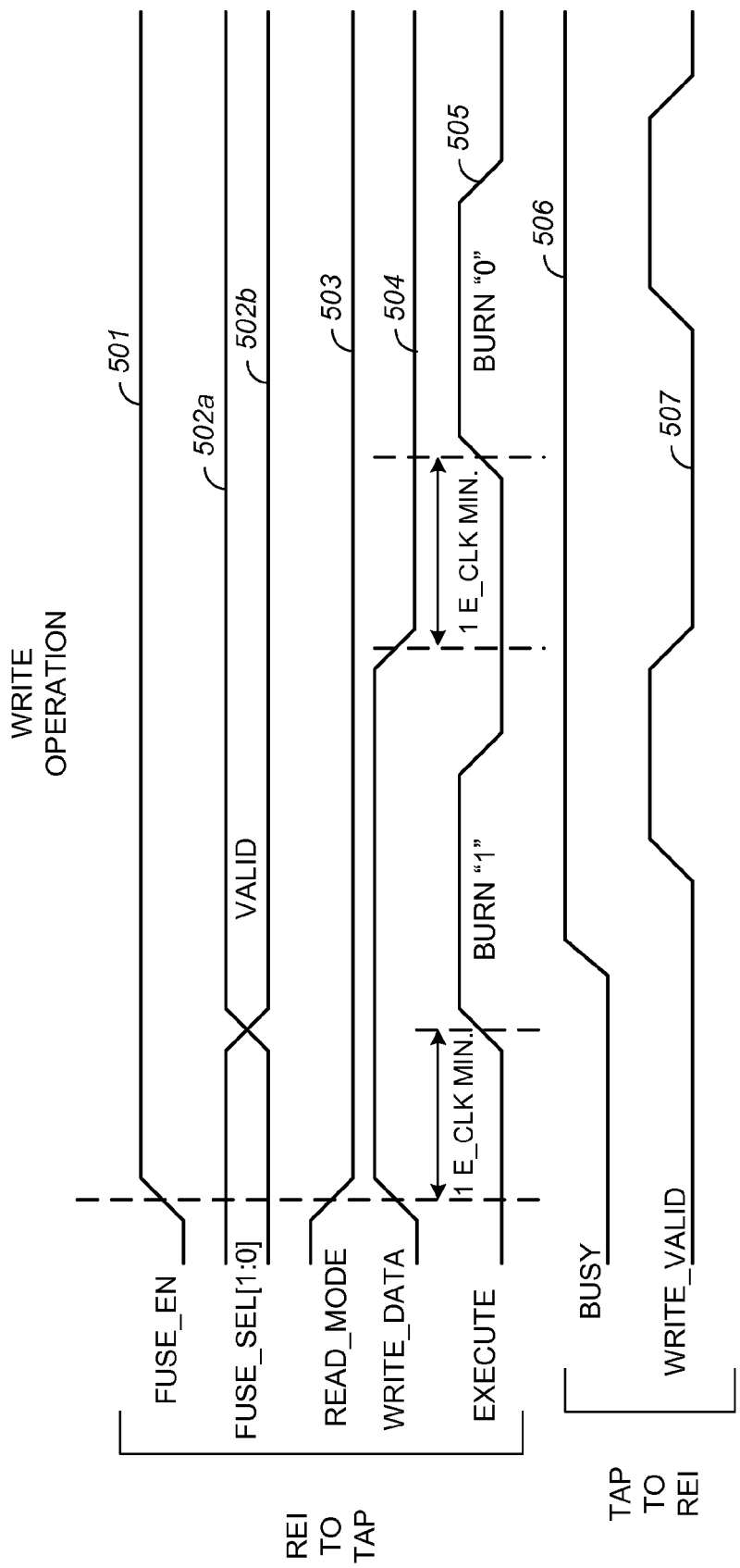
FIG. 5 is a waveform diagram of an embodiment of the relative signal timing of a write eFuse operation directed by the RAM eFuse interface of FIG. 1.

FIG. 5 is a waveform diagram of an example embodiment of the relative signal timing of a write operation directed by the REI 300 of FIG. 1. As illustrated in FIG. 5, the FUSE_EN, FUSE_SEL, READ_MODE, WRITE_DATA, EXECUTE, BUSY and WRITE_VALID signals are involved in a write operation. A clock signal is not shown because the TAP-REI interface is an asynchronous interface. The REI 300 asserts the FUSE_EN, FUSE_SEL, READ_MODE, WRITE_DATA and EXECUTE signals. The TAP 150 asserts the BUSY and WRITE_VALID signals. A write operation occurs when TAP_REI_MODE is "10" and TAP_REI_RUN is asserted. A signal is asserted when it transitions from a logic "0" or low value to a logic "1" or high value.

The FUSE_EN signal is represented by trace 501. The FUSE_EN signal is asserted for the write operation to occur. The FUSE_SEL signal is represented by trace 502a and trace 502b. The FUSE_SEL signal decodes into the address for the eFuse device. The READ_MODE signal is represented by trace 503. The READ_MODE signal is deasserted to indicate that the REI 300 intends to send data to the TAP 150, which in turn writes or burns the data to the addressed eFuse device. The WRITE_DATA signal is represented by trace 504. The WRITE_DATA signal is asserted when the REI 300 intends to write or burn a logic "1" to the eFuse. The WRITE_DATA signal is deasserted when the REI 300 intends to write or burn a logic "0" to the eFuse. The EXECUTE signal is represented on trace 505. As illustrated in FIG. 5, the REI 300 waits for at least one E_CLK clock cycle after the FUSE_EN, READ_MODE and WRITE_DATA signals are valid before asserting the EXECUTE signal. As indicated in FIG. 5, the TAP 150 burns a "1" when the EXECUTE signal and the WRITE_DATA signal are both asserted. After the EXECUTE signal is asserted by the REI 300, the TAP 150 responds by asserting the BUSY signal represented by trace 506. Once the TAP 150 has successfully written or burned the logic "1" to the addressed eFuse, which may take many E_CLK clock cycles to complete, the TAP 150 asserts the WRITE_VALID signal represented by trace 507. The REI 300 drives the EXECUTE signal to logic "0" when it receives the WRITE_VALID signal from the TAP 150. In turn, the TAP 150 drives the WRITE_VALID signal to logic "0" when it receives the logic "0" on the EXECUTE signal from the REI 300. A minimum of one E_CLK clock cycle after the WRITE_DATA signal represented by trace 504 transitions to the next data bit, in this example from a logic "1" to a logic "0", the REI 300 asserts the EXECUTE signal to burn a logic "0" in the next storage location within the addressed eFuse device. This write operation is repeated for each bit available in the eFuse device.

All bits are burned or written to the eFuse device serially. Once each bit of the first eFuse device is written, the REI 300 adjusts the FUSE_SEL signal to indicate that data should be written to the next eFuse device. The burning or writing continues until all eFuse devices have been addressed and the corresponding memory redundancy data burned.

Figure 6:
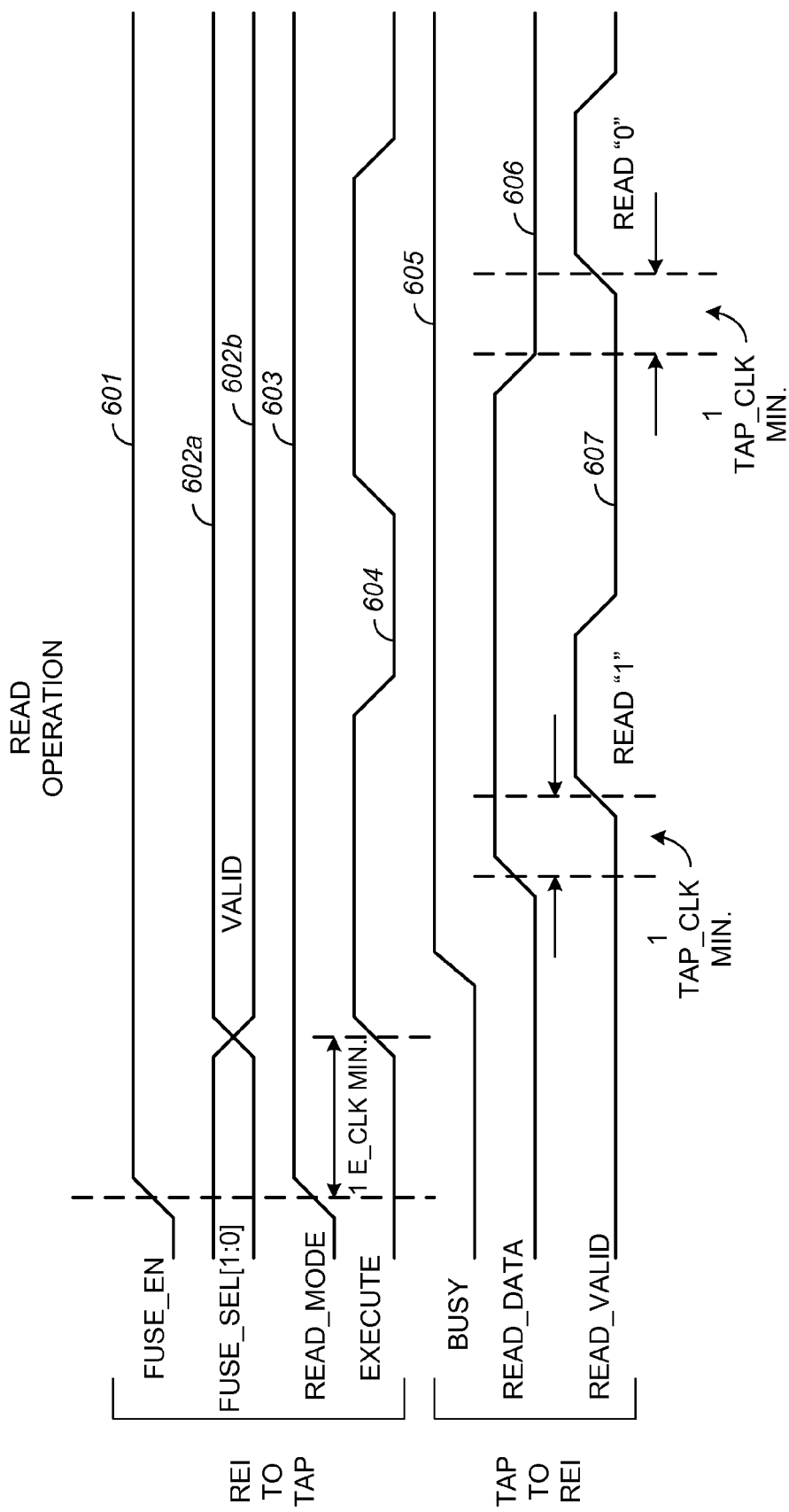
FIG. 6 is a waveform diagram of an embodiment of the relative signal timing of a read eFuse operation directed by the RAM eFuse interface of FIG. 1.

FIG. 6 is a waveform diagram of an example embodiment of the relative signal timing of a read operation directed by the REI 300 of FIG. 1. As illustrated in FIG. 6, the FUSE_EN, FUSE_SEL, READ_MODE, EXECUTE, BUSY, READ_DATA and READ_VALID signals are involved in a read operation. A clock signal is not shown because the TAP-REI interface is an asynchronous interface. The REI 300 asserts the FUSE_EN, FUSE_SEL, READ_MODE and EXECUTE signals. The TAP 150 asserts the BUSY, READ_DATA and READ_VALID signals. A read operation occurs when the TAP_REI_MODE signal is "00" and the TAP_REI_RUN signal is asserted or when the CORE_REI_MODE signal is a "0" and the CORE_REI_RUN signal is asserted. A signal is asserted when it transitions from a logic "0" or low value to a logic "1" or high value. A signal is deasserted when it transitions from a logic "1" or high value to a logic "0" or low value.

The FUSE_EN signal is represented by trace 601. The FUSE_EN signal is asserted for the read operation to occur. The FUSE_SEL signal is represented by trace 602a and trace 602b. The FUSE_SEL signal decodes into the address of the select eFuse device. The READ_MODE signal is represented by trace 603. The READ_MODE signal is asserted to indicate that the REI 300 intends to read data from the addressed eFuse device via the TAP 150. The EXECUTE signal is represented on trace 604. As illustrated in FIG. 6, the REI 300 waits for at least one E_CLK clock cycle after the FUSE_EN and READ_MODE signals are valid before asserting the EXECUTE signal. The read operation begins when the REI 300 asserts the EXECUTE signal. Once the REI 300 asserts the EXECUTE signal, the TAP 150 responds by asserting the BUSY signal represented by trace 605. As illustrated in FIG.

6, the REI 300 reads a logic "1" when the READ_DATA signal represented by trace 606 and the READ_VALID signal represented by trace 607 are both asserted. The REI 300 reads a logic "0" when the READ_DATA signal represented by trace 606 is deasserted and the READ_VALID signal represented by trace 607 is asserted. The TAP 150 reads the data from the addressed eFuse, asserts or deasserts the READ_DATA signal represented on trace 606 in accordance with the data value read from the eFuse and at least one TAP_CLK clock cycle thereafter, asserts the READ_VALID signal represented on trace 607. In turn, the REI 300 captures the READ_DATA bit into its internal register and drives the EXECUTE signal to logic "0" when it detects that the READ_VALID signal has been asserted by the TAP 150. In turn, the TAP 150 drives the READ_VALID to logic "0" when it detects that the EXECUTE signal has returned to logic "0." This read operation is repeated for each bit available in the eFuse device.

All bits are read from the addressed eFuse device serially. Once each bit of the eFuse device is read, the REI 300 adjusts the FUSE_SEL signal to indicate that data should be read from the next eFuse device. The reading continues until all eFuse devices have been addressed and the corresponding memory redundancy data read into the REI 300.

Figure 7:
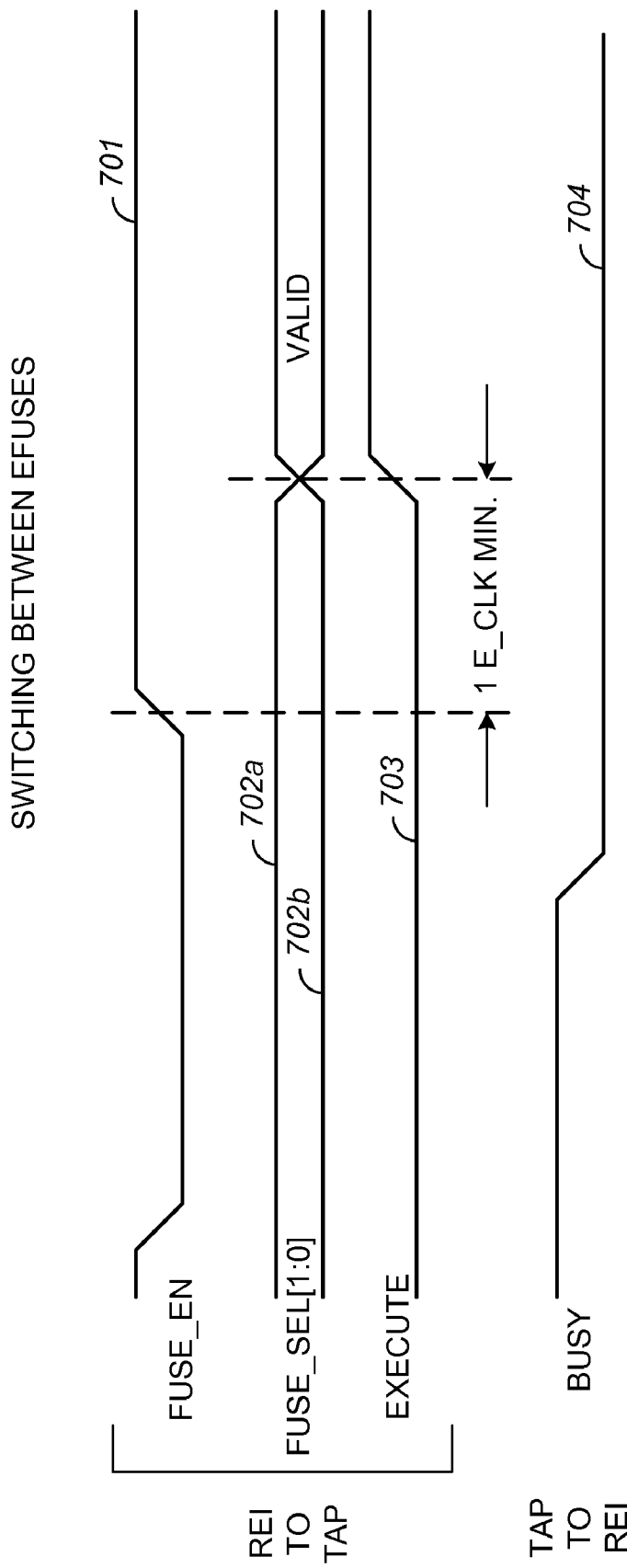
FIG. 7 is a waveform diagram of an embodiment of the relative signal timing of a switch eFuse operation directed by the RAM eFuse interface of FIG. 1.

FIG. 7 is a waveform diagram of an example embodiment of the relative signal timing of a switch eFuse operation directed by the REI 300 of FIG. 1. The REI 300 switches between eFuse devices during both write operations and read operations. In a preferred embodiment, the REI 300 writes to eFuse devices in ascending order (i.e., eFuse 0, eFuse 1, eFuse 2, etc.) and reads from eFuse devices in descending order (i.e., eFuse N, eFuse(N-1), eFuse(N-2), etc.).

As indicated in the timing diagram of FIG. 7, the REI 300 deasserts the FUSE_EN signal represented on trace 701 and waits for the TAP 150 to deassert the BUSY signal represented on trace 704, which resets the TAP-eFuse interface, before reasserting the FUSE_EN signal. At least one E_CLK clock cycle after the FUSE_EN signal has been asserted, the REI 300 sets the proper address on FUSE_SEL signals represented on trace 702a and 702b and asserts the EXECUTE signal represented by trace 703.

FIG. 8A is a waveform diagram of an example embodiment of the relative signal timing of a shift-in operation from the redundancy chain directed by the REI 300 of FIG. 1. The REI 300 shifts-in redundancy information from the RAM elements and compresses the data when the TAP_REI_MODE signal is "11" and the TAP_REI_RUN signal is asserted. A shift-in operation functions in accordance with the E_CLK, CLK_SEL, SHIFT_EN and DATA_IN signals. The E_CLK signal is represented by trace 801. The CLK_SEL signal is represented by trace 802. The SHIFT_EN signal is represented by trace 803. The DATA_IN signal is represented by trace 804a and trace 804b. The double lines represent when data is valid or invalid (invalid before the crossing). The data signal voltage can be driven as logic zero, represented by trace 804a, or driven as logic one, represented by trace 804b during the valid time. Data values are captured at every clock edge. The REI 300 asserts the CLK_SEL signal to select the E_CLK over the nominal functional clock. The REI 300 allows 2 clock cycles for clock gating in the RAM elements to stabilize. Thereafter, the REI 300 asserts the SHIFT_EN signal. The REI 300 expects valid data to be shifted into the REI 300 in the next clock cycle as shown by trace 804a and trace 804b. Data is shifted in at one-bit per clock cycle until all data is shifted in.

FIG. 8B is a waveform diagram of an example embodiment of the relative signal timing of a shift-out operation into the redundancy chain directed by the REI 300 of FIG. 1. The REI 300 decompresses the stored redundancy data and shifts-out redundancy information from the REI to the RAM elements when the TAP_REI_MODE signal is "01" and the TAP_REI_RUN signal is asserted or when the CORE_REI_MODE signal is a "1" and the CORE_REI_RUN signal is asserted A shift-out operation functions in accordance with the E_CLK, CLK_SEL, SHIFT_EN and data_out signals. The E_CLK signal is represented by trace 801. The CLK_SEL signal is represented by trace 802. The SHIFT_EN signal is represented by trace 803. The data_out signal is represented by trace 805a and trace 805b. The REI 300 asserts the CLK_SEL signal to select the E_CLK over the nominal functional clock. The REI 300 allows 2 clock cycles for clock gating in the RAM elements to stabilize. Thereafter, the REI 300 asserts the SHIFT_EN signal. The REI 300 shifts data from the REI 300 into the redundancy chain upon assertion of the SHIFT_EN signal as shown by trace 805a and trace 805b. Data is shifted out at one-bit per clock cycle until all data is shifted out.

Figure 9:
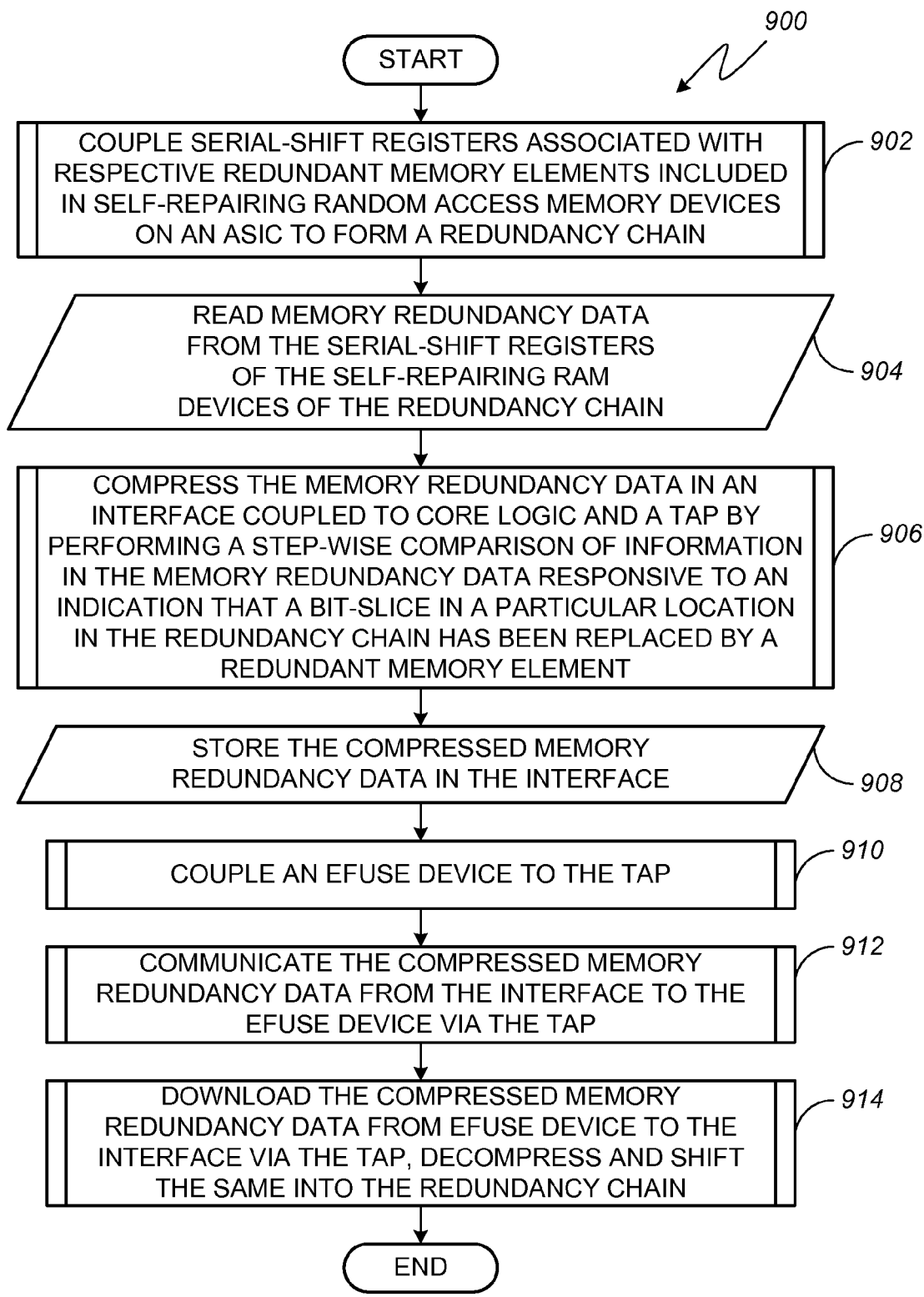
FIG. 9 is a flow chart illustrating a method for processing memory redundancy data.

FIG. 9 is a flow chart illustrating an example embodiment of a method 900 for processing memory redundancy data. The method 900 begins with block 902 where serial-shift registers associated with respective redundant memory elements in self-repairing RAM devices on an ASIC are coupled to form a redundancy chain. Thereafter, as indicated in input/output block 904, the REI 300 reads memory redundancy data from the serial-shift registers of the self-repairing RAM devices of the redundancy chain. In block 906, the REI 300 compresses the memory redundancy data by performing a step-wise comparison of information in the memory redundancy data. The step-wise comparison is responsive to an indication that a bit-slice in a particular location in the redundancy chain has been replaced by a redundant memory element. As indicated in input/output block 908, the REI 300 stores a compressed representation of the memory redundancy data. In block 910, an eFuse device is coupled to the TAP. Thereafter, as indicated in block 912, the REI 300 communicates the compressed memory redundancy data to the eFuse device via the TAP. In block 914, which is generally performed after a power down operation and a subsequent power up operation on the ASIC, the REI 300 downloads the compressed memory redundancy data from the eFuse device via the TAP. The REI 300 decompresses and shifts the compressed memory redundancy data into the redundancy chain.

Figure 10:
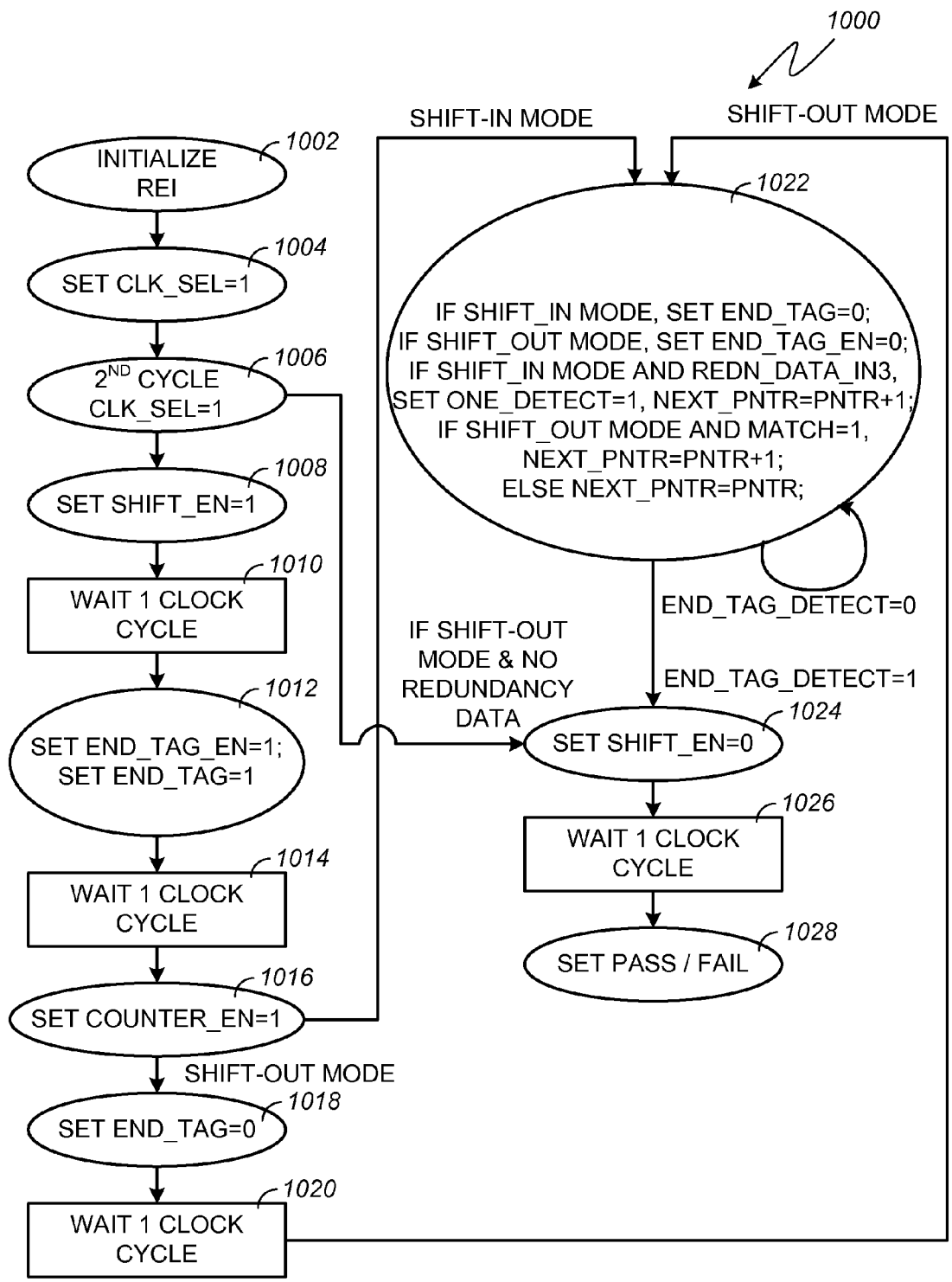
FIG. 10 is a state diagram illustrating operation of the RAM eFuse interface of FIG. 1.

FIG. 10 is a state diagram 1000 illustrating operation of the REI 300 of FIG. 1 when the REI 300 is operating in shift-in mode (e.g., the TAP_REI_MODE signal="11") or shift-out mode (e.g., the TAP_REI_MODE signal="01" or CORE_REI_MODE signal="1). In the state diagram 1000 a signal set in an initialization state or any time thereafter remains at the same logic level until it is changed in a subsequent state. The REI 300 begins with an initialization state 1002 where default values are set. In the initialization state 1002, the CLK_SEL, SHIFT_EN, COUNTER_EN, END_TAG_EN, ONE_DETECT and NEXT_PNTR signals are all set to logic "0." In state 1004, the CLK_SEL signal is set to logic "1." Next, in state 1006, the CLK_SEL signal is set again to logic "1" to ensure that the clock signal has settled across the RAM elements of the redundancy chain. During shift-out mode, if no redundancy data is stored in the eFuse shadow register 340 (i.e., the eFuse shadow register contains all zeros), then the shift-out phase is skipped and processing resumes with state 1024 as shown in FIG. 10.

Otherwise, when the eFuse shadow register 340 contains redundancy data (i.e., the eFuse shadow register does not contain all zeros), then processing continues with state 1008, where the SHIFT_EN signal is set to logic "1." Thereafter, in state 1010, the REI 300 waits for one clock cycle. Next, in state 1012, the REI 300 sets the END_TAG_EN and END_TAG signals to a logic "1." In state 1014, the REI 300 waits for one clock cycle. In state 1016, the COUNTER_EN signal is set to logic "1." When the REI 300 is operating in the shift-in mode, processing continues with state 1022. Otherwise, when the REI 300 is operating in the shift-out mode, processing continues with state 1018. In state 1018, the END_TAG signal is set to logic "0." Thereafter, as indicated in state 1020, the REI 300 waits one clock cycle before continuing with state 1022. State 1022 is active during the majority of the redundancy data processing. When the REI 300 is operating in shift-in mode, the REI 300 sets the END_TAG signal to logic "0." If the REDN_DATA_IN3 signal is asserted (i.e., the signal on connection 377 (FIG. 3)), the REI 300 sets the ONE_DETECT signal to logic "1" which causes the eFuse shadow register 340 to store the output of the counter (i.e., the signal on connection 335 (FIG. 3)) in the array 344 and sets the NEXT_PNTR signal to the sum of the PNTR signal and one. Otherwise, if the REDN_DATA_IN3 signal is not asserted, the REI 300 replaces the NEXT_PNTR with the contents of the PNTR signal. When the END_TAG_DETECT signal is not asserted (i.e., the signal on connection 379 is at a logic "0" value), the REI 300 repeats state 1022, otherwise it moves to state 1024. When the REI 300 is operating in shift-out mode, the REI 300 sets the END_TAG_EN signal to logic "0." When the REI 300 has asserted the MATCH signal indicating that the present count from the counter and the contents of the eFuse shadow register match, the REI 300 sets the NEXT_PNTR signal to the sum of the PNTR signal and one. Otherwise, when the MATCH signal is not asserted, the REI 300 sets the contents of the NEXT_PNTR signal to the contents of the PNTR signal. The REI 300 continues processing in this manner until the END_TAG_DETECT signal on connection 379 (FIG. 3) is asserted. The END_TAG_DETECT is asserted when the detector has indicated that three consecutive logic "1" values have been received from the redundancy chain. Once the END_TAG_DETECT signal is asserted, the REI 300 responds by deasserting the SHIFT_EN signal as indicated in state 1024. In state 1026, the REI 300 waits one clock cycle. Thereafter, in state 1028, the REI 300 sets the pass/fail signals that are communicated to the TAP 150 and the core logic 110. The REI 300 will set the fail signal when the number of repaired memory elements in the ASIC 100 exceeds the number of repairs that can be recorded in the eFuse shadow register 340.

While various example embodiments of the circuits and methods for processing memory redundancy data have been described, it will be apparent to those of ordinary skill in the art that many more embodiments and implementations are possible that are within the scope of this disclosure. For example, one or more REIs may be implemented in conjunction with two or more separate and distinct redundancy chains as explained above. By way of further example, the eFuse shadow register 340, which stores the compressed redundancy information in the REI 300 may be configured as a separate and distinct device on the ASIC 100. Accordingly, the described circuits and methods for processing memory redundancy data are not to be restricted or otherwise limited except in light of the attached claims and their equivalents.

What is claimed is:

1. A method for processing memory redundancy data, the method comprising:
coupling serial-shift registers associated with respective redundant memory elements included in self-repairing random access memory devices on an application specific integrated circuit (ASIC) to form a redundancy chain;
reading memory redundancy data from the serial-shift registers of the self-repairing random access memory devices of the redundancy chain;
compressing the memory redundancy data in an interface coupled to the redundancy chain, a core logic and a test access port (TAP) on the ASIC, wherein compressing comprises a step-wise comparison of information in the memory redundancy data, the step-wise comparison responsive to an indication that a bit-slice in a particular location in the redundancy chain has been replaced by a redundant memory element;
in a first mode of operation, storing the compressed memory redundancy data in an array of volatile memory elements in the interface coupled to the redundancy chain;
coupling an eFuse device to the TAP; and
in a second mode of operation, communicating the compressed memory redundancy data from the volatile memory elements in the interface to the eFuse device via the TAP for storage in the eFuse device;
subsequent to the communicating, downloading the compressed memory redundancy data stored in the eFuse device by communicating the same to the interface via the TAP, storing the compressed memory redundancy data in the interface, and using the interface to decompress and shift the memory redundancy data through the serial-shift registers of the redundancy chain.

2. The method of claim 1, wherein reading memory redundancy data from the serial-shift registers of the self-repairing random access memory devices of the redundancy chain is performed after a built-in self test procedure at the completion of which the redundancy chain contains memory redundancy data that enables each self-repairing random access memory device to pass a test.

3. The method of claim 1, wherein compressing the memory redundancy data comprises enabling a counter.

4. The method of claim 3, wherein compressing the memory redundancy data comprises, operating a state machine that updates the counter and identifies when a first data value is present in the memory redundancy data.

5. The method of claim 1, wherein storing the compressed memory redundancy data in the interface comprises using an array of storage registers responsive to a pointer input, a data input and a present count.

6. The method of claim 5, wherein when a first instance of a first data value is present in the memory redundancy data the present count is stored in a first row of associated storage registers and the pointer is incremented.

7. The method of claim 6, wherein when a second instance of the first data value is present in the memory redundancy data the present count is stored in a second row of associated storage registers and the pointer is incremented.

8. The method of claim 1, wherein communicating the compressed memory redundancy data from the interface to the eFuse device via the TAP comprises directing the TAP to program the memory redundancy data in a set of eFuse elements.

9. The method of claim 1, further comprising:
identifying from the memory redundancy data an end of the redundancy chain.

10. An interface for processing memory redundancy data on an application specific integrated circuit (ASIC) with self-repairing random access memory elements, the interface comprising:

a state machine having a data input and a data output coupled to a redundancy chain, the redundancy chain including coupled redundant elements of respective random access memory elements on the ASIC, the state machine configured to generate a first control signal, a second control signal, and a third control signal;

an interface counter arranged to receive the first control signal and generate a present count; and an array of registers operating in a single clock domain and indirectly coupled to a non-volatile storage element through a test access port interface, the array of registers arranged to receive and store a bit in the array of registers in response to the present count, the second control signal and the third control signal, wherein the third control signal is communicated to the array of registers via a decoder.

11. The interface of claim 10, wherein the second control signal identifies when a received bit from the redundancy chain is a first logic value.

12. The interface of claim 10, wherein an output from the decoder selects a row in the array of registers in accordance with the third control signal when the interface is operating in a shift-in mode.

13. The interface of claim 10, further comprising:
a first multiplexer coupled to the array of registers, the first multiplexer arranged to select a row in the array of registers in accordance with the third control signal when the interface is operating a shift-out mode.

14. The interface of claim 13, further comprising:
a redundancy data controller comprising a comparator and a second multiplexer, the comparator arranged to receive a present count value and a select output of the array of registers from the first multiplexer and generate a comparator output that identifies when the present count value and the select output of the array of registers match, the second multiplexer receiving a data signal from the state machine at a first input and the comparator output at a second input, the second multiplexer forwarding one of the first input and the comparator output in accordance with the data enable signal from the state machine.

15. The interface of claim 10, further comprising:
a detector coupled to the data input, the detector arranged to identify the end of redundancy data from the redundancy chain by forwarding a detection signal to the state machine.

16. The interface of claim 15, wherein the detector is responsive to a series of P consecutive bits each having the first logic value where P is an integer value.

17. The interface of claim 10, the state machine generating a fourth control signal and a fifth control signal that are distributed to respective inputs of each self-repairing random access memory element in the redundancy chain.

18. The interface of claim 17, wherein the fourth control signal directs each self-repairing random access memory element in the redundancy chain to select an external clock that is different from a nominal memory clock.

19. The interface of claim 17, wherein the fifth control signal directs each self-repairing random access memory element in the redundancy chain to shift one bit.

20. The interface of claim 10, wherein the state machine comprises an asynchronous test access port bus for communicating commands to an eFuse element coupled to the test access port.

* * * * *